United States Patent
Yang et al.

(10) Patent No.: US 11,757,695 B2
(45) Date of Patent: Sep. 12, 2023

(54) PREDISTORTION SYSTEM WITH TARGETED SPECTRUM EMISSION FOR WIRELESS COMMUNICATION

(71) Applicant: SUMITOMO ELECTRIC DEVICE INNOVATIONS, INC., Yokohama (JP)

(72) Inventors: Ruikang Yang, Bridgewater, NJ (US); Michael Russo, Morris Plains, NJ (US); Simon Hamparian, Emerson, NJ (US)

(73) Assignee: SUMITOMO ELECTRIC DEVICE INNOVATIONS, INC., Yokohama (JP)

( * ) Notice: Subject to any disclaimer, the term of this patent is extended or adjusted under 35 U.S.C. 154(b) by 0 days.

(21) Appl. No.: 17/542,710

(22) Filed: Dec. 6, 2021

(65) Prior Publication Data

US 2023/0179467 A1  Jun. 8, 2023

(51) Int. Cl.
*H04L 25/49* (2006.01)
*H04L 27/36* (2006.01)
*H04L 27/38* (2006.01)
*H04L 27/26* (2006.01)

(52) U.S. Cl.
CPC .......... *H04L 27/367* (2013.01); *H04L 27/2695* (2013.01); *H04L 27/3836* (2013.01)

(58) Field of Classification Search
CPC ................. H03F 1/3247; H03F 1/3241; H04B 2001/0433; H04B 2001/0425; H04B 1/0475; H04L 27/368; H04L 27/367
See application file for complete search history.

(56) References Cited

U.S. PATENT DOCUMENTS

| | | | | |
|---|---|---|---|---|
| 9,628,030 B1* | 4/2017 | Naidu et al. | ........... | H04L 25/03 |
| 10,763,905 B1* | 9/2020 | Luo et al. | ............ | H04L 1/0071 |
| 2008/0187035 A1* | 8/2008 | Nakamura et al. | .... | H03F 3/245 |
| | | | | 375/232 |
| 2014/0191799 A1* | 7/2014 | Ohkawara et al. | ....... | H03F 3/19 |
| | | | | 330/149 |
| 2015/0049841 A1 | 2/2015 | Laporte et al. | | |
| 2021/0152133 A1 | 5/2021 | Mochida | | |

OTHER PUBLICATIONS

Abdelaziz, Mahmoud et al., "Decorrelation-Based Concurrent Digital Predistortion With a Single Feedback Path," IEEE transactions on microwave theory and technique, IEEE, USA, vol. 66, No. 1, Jan. 1, 2018, p280-p293.

Ding, Lei et al., "A Robust Digital Baseband Predistorter Constructed Using Memory Polynomials," IEEE transactions on communications, VOL. 52, No. 1, Jan. 2004, pp. 159-165.

Wood, John, "System-Level Design Considerations for Digital Pre-Distortion of Wireless Base Station Transmitters," IEEE Transactions on microwave theory and techniques, IEEE, USA, vol. 65, No. 5, May 1, 2017, p1880-p1890.

* cited by examiner

*Primary Examiner* — David S Huang
(74) *Attorney, Agent, or Firm* — Faegre Drinker Biddle & Reath LLP

(57) ABSTRACT

Various embodiments of the present disclosure relate to transmitter systems, methods, and instructions for signal predistortion. The transmitter system includes an intermodulation distortion (IMD) filter module configured to filter a detected feedback signal ($Y_{in}$) to generate a targeted filtered signal ($Y_{out}$), a digital pre-distortion (DPD) coefficient estimation module configured to update signal generation coefficients based on comparing an input signal ($S_{in}$) with the targeted filtered signal ($Y_{out}$), and a distortion compensation processing module configured to generate a pre-distorted signal ($U_{out}$) based on the input signal ($S_{in}$) using the updated signal generation coefficients.

21 Claims, 10 Drawing Sheets

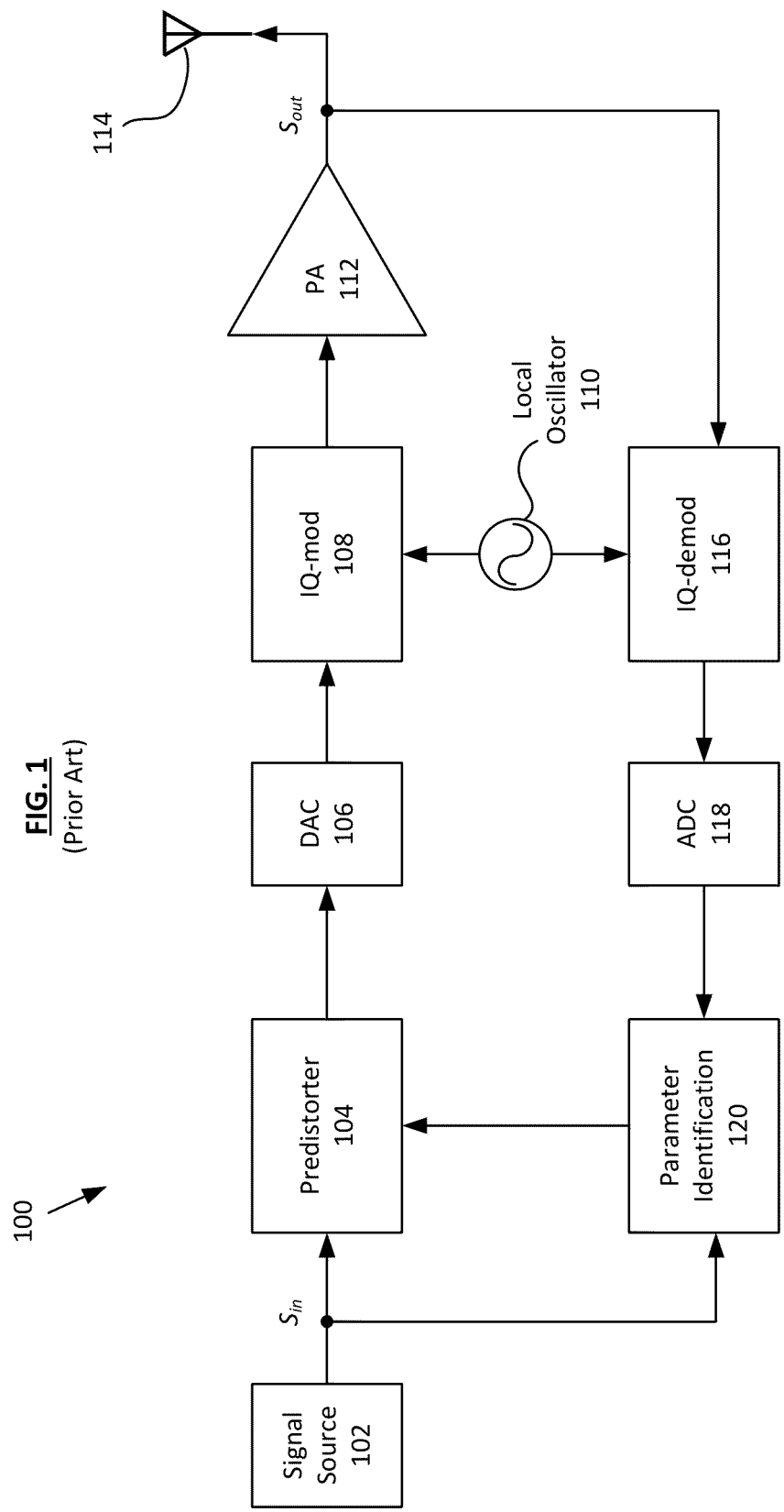

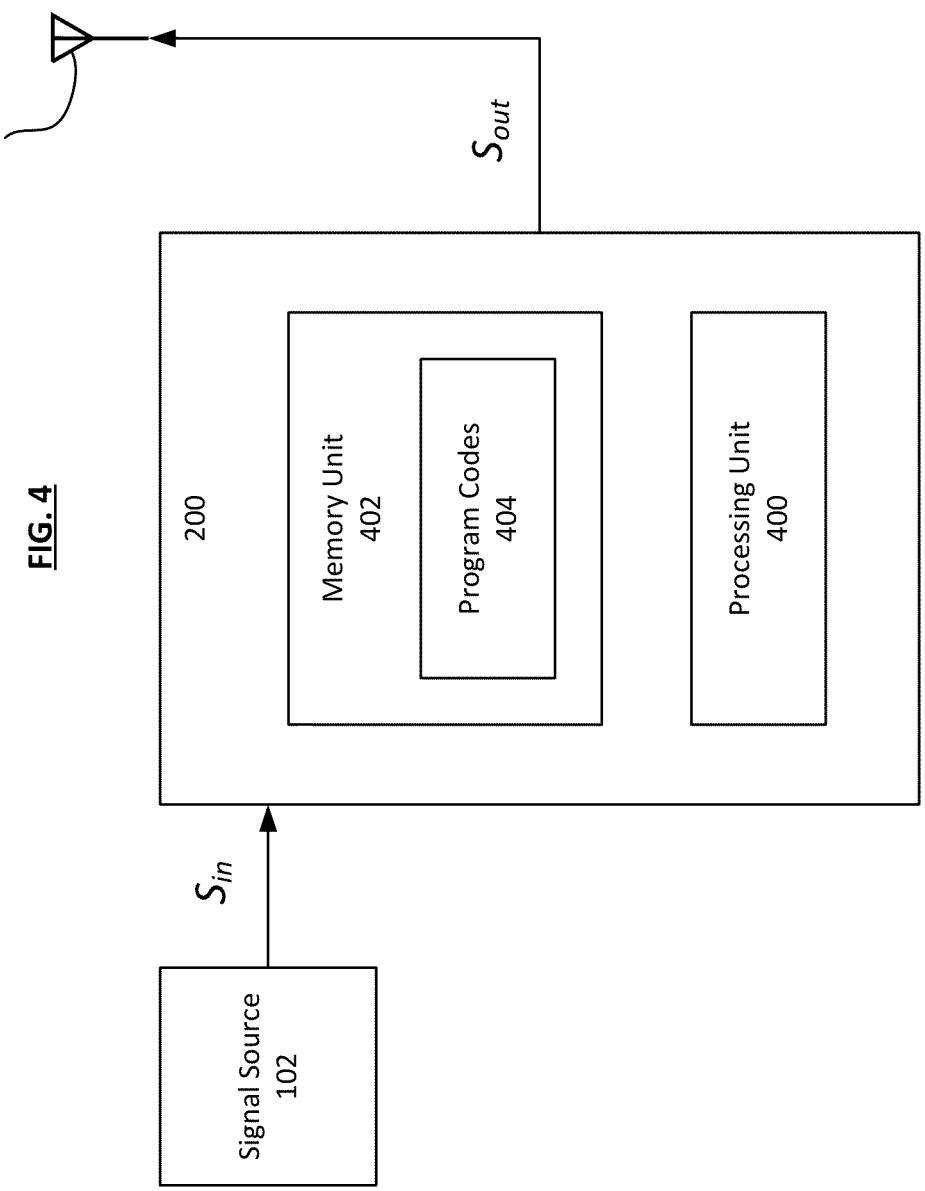

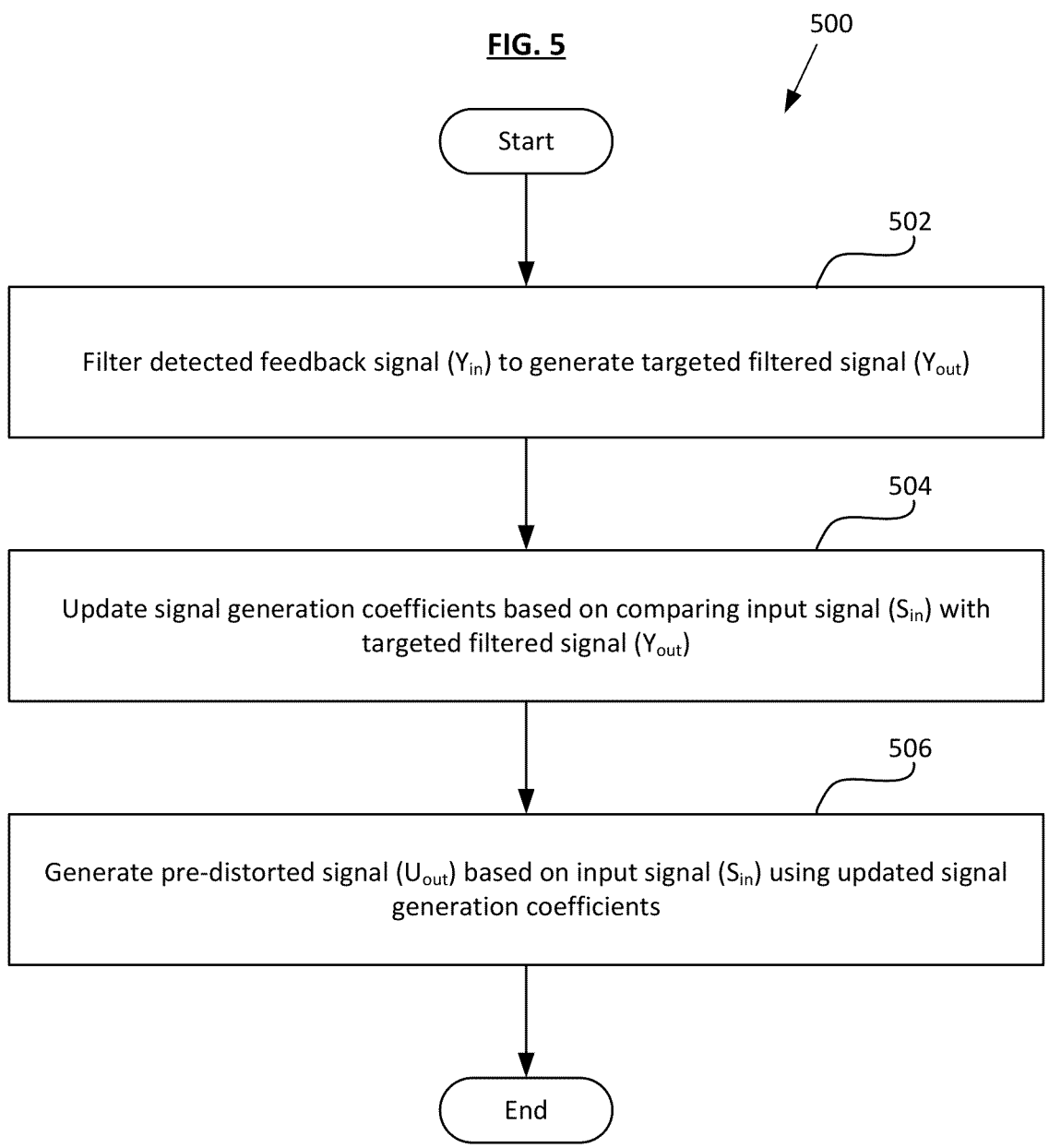

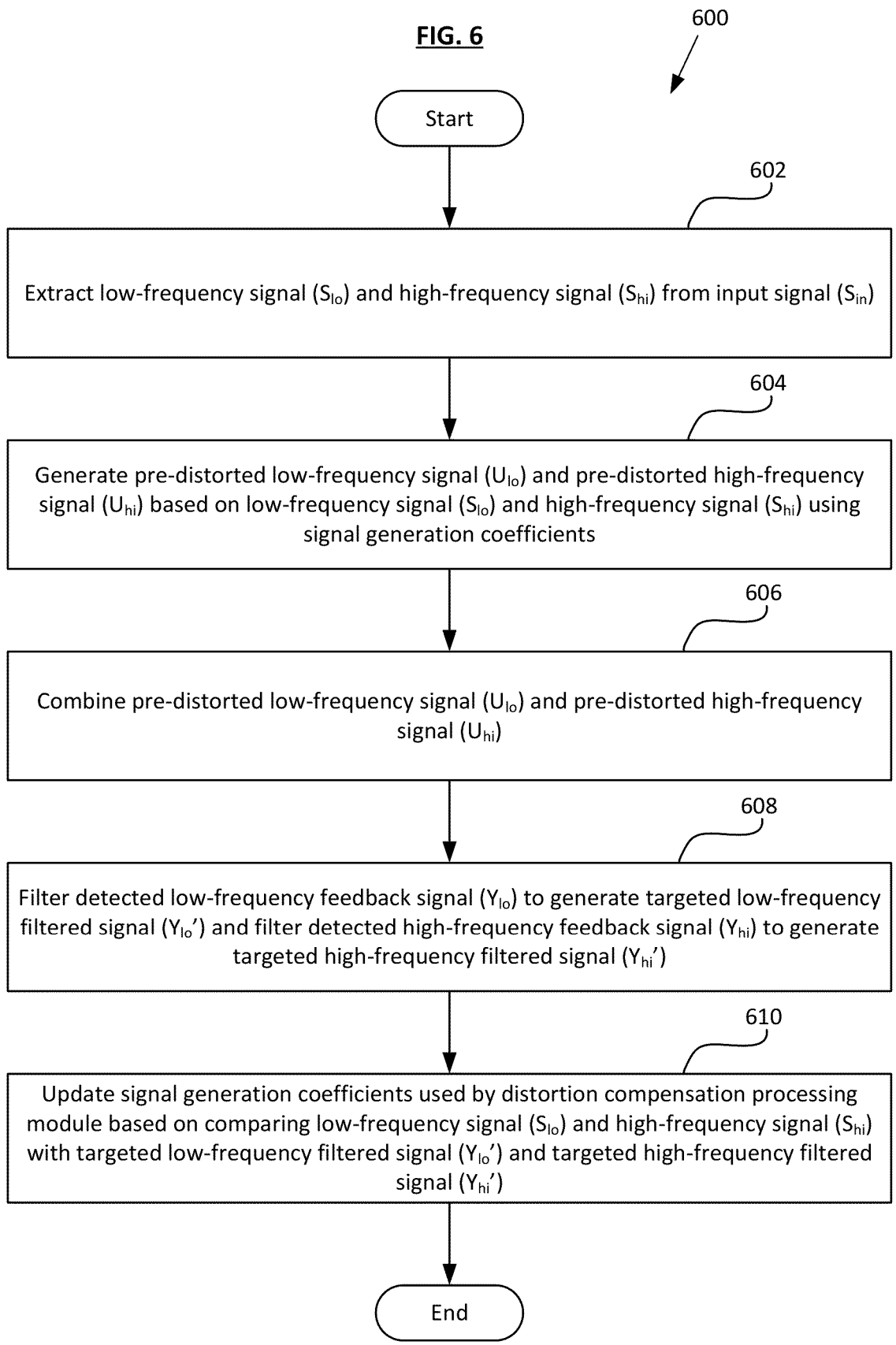

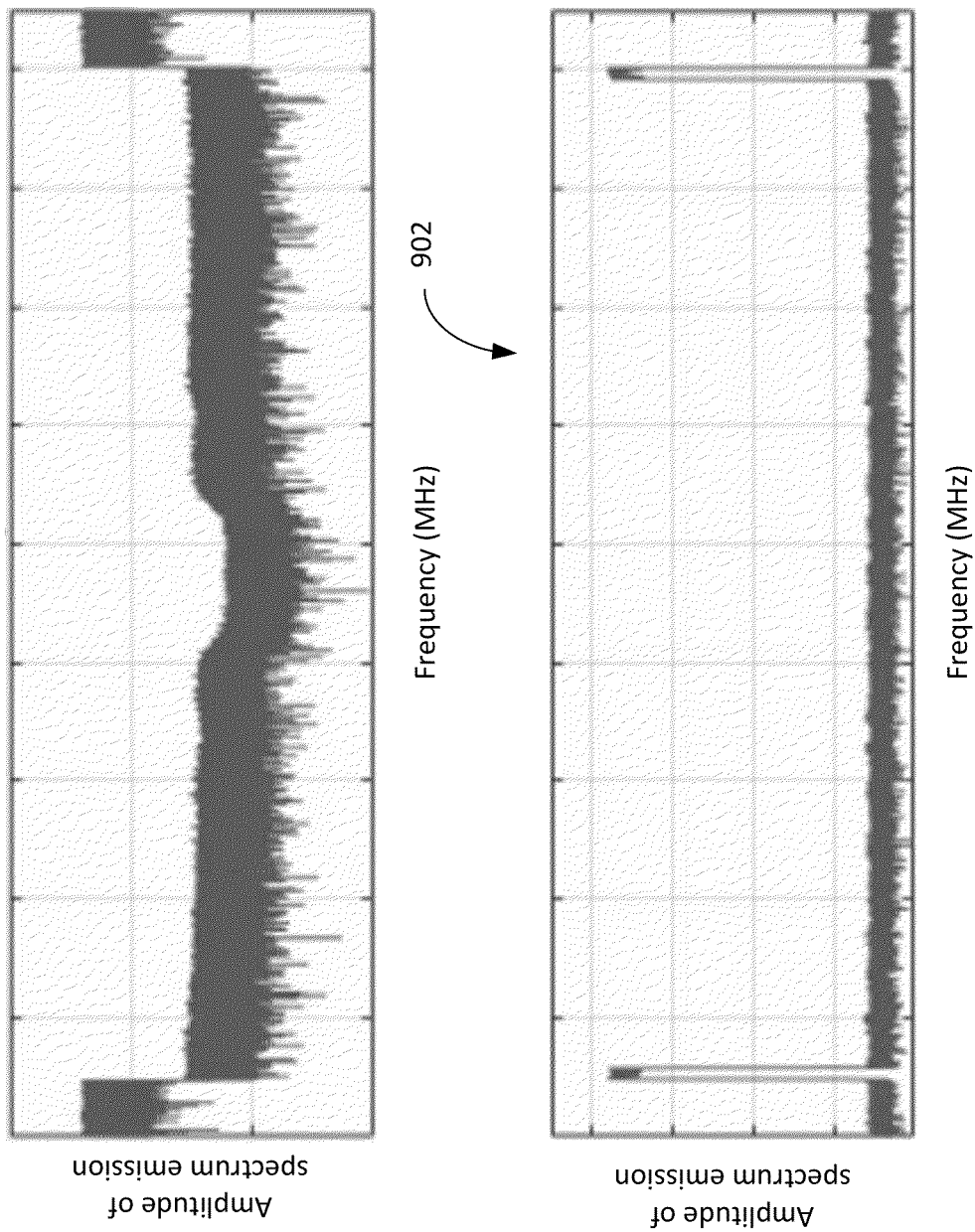

PREDISTORTION SYSTEM WITH TARGETED SPECTRUM EMISSION FOR WIRELESS COMMUNICATION

FIELD OF THE DISCLOSURE

The present disclosure relates generally to distortion compensation for an amplifier and, more particularly, to a system and method for compensating for amplifier distortion.

BACKGROUND OF THE DISCLOSURE

Amplifiers can have non-linear characteristics. Distortion compensation techniques are used for compensating for distortions in signals caused by the non-linear characteristics. An instantaneous change in distortion may occur in a GaN amplifier, for example. Such distortions can degrade the bit-error rate (BER) performance of the amplifier.

FIG. 1 illustrates a prior art system 100 for performing distortion compensation which implements a predistorter and a parameter identification module therefor. The system 100 includes a signal source 102 which provides a digital input signal ($S_{in}$) that is initially provided to a digital-analog converter (DAC) 106 to be converted into an analog radio-frequency (RF) input signal. An in-phase/quadrature (IQ) signal modulator 108 performs IQ modulation on the RF input signal based on a predetermined frequency of a local oscillator 110 to provide a signal to be amplified by a power amplifier (PA) 112, the resulting signal of which is an output signal ($S_{out}$) to be transmitted through an antenna 114.

In the prior art system 100, the change in distortion in the PA 112 is dealt with by updating distortion compensation coefficients implemented in a distortion compensation device in response to the change in the distortion. Specifically, the output signal ($S_{out}$) is provided via a feedback loop to an IQ signal demodulator 116, using the same frequency of the local oscillator 110 as the IQ modulator 108, and the demodulated signal is provided to the analog-digital converter (ADC) 118 to be provided to a parameter identification module 120, which is part of the distortion compensation device. The parameter identification module 120 receives the input signal ($S_{in}$) and compares it to the received signal from the ADC 118, then updates the distortion compensation coefficients to be used by a predistorter module 104, also part of the distortion compensation device, such that the output signal to be provided to the DAC 106 would be predistorted to accommodate for the distortion caused by the PA 112.

The predistorter module 104, known in the art, is implemented in the digital baseband domain and generates a complementary nonlinearity to that of the PA 112. The predistorted baseband signal is upconverted to the RF signal via the IQ modulator 108 and then feed to the PA 112. To synthesize the predistorter function, a portion of the signal from the PA 112 is extracted and down-converted via the IQ demodulator 116 to be used to estimate the parameters of a predistorter model.

By updating the distortion compensation coefficients, distortion compensation characteristics of the distortion compensation device are updated in response to the change in the distortion. In order to follow an instantaneous change in distortion, it is necessary to perform frequent updating of the distortion compensation characteristics. Since a processing load for updating the distortion compensation characteristics is great, however, it is not always easy to frequently update the distortion compensation characteristics in preparation for a change in distortion. Therefore, an improved technique for dealing with a change in distortion is desired.

SUMMARY OF THE DISCLOSURE

Various embodiments of the present disclosure relate to transmitter systems for signal predistortion, including the embodiment of the system described in this paragraph. The transmitter system includes an intermodulation distortion (IMD) filter module configured to filter a detected feedback signal ($Y_{in}$) to generate a targeted filtered signal ($Y_{out}$), a digital pre-distortion (DPD) coefficient estimation module configured to update signal generation coefficients based on comparing an input signal ($S_{in}$) with the targeted filtered signal ($Y_{out}$), and a distortion compensation processing module configured to generate a pre-distorted signal ($U_{out}$) based on the input signal ($S_{in}$) using the updated signal generation coefficients.

In some examples, the IMD filter module further includes a gain mask generating module configured to generate a gain mask based on at least one transmission measurement; a gain mask processing module configured to apply the gain mask to the detected feedback signal ($Y_{in}$); a filter design generating module configured to generate a signal filter based on at least one transmission requirement; and a targeted filtered signal generating module configured to generate the targeted filtered signal ($Y_{out}$) based on the signal filter.

In some examples, the at least one transmission measurement includes a gain response of an amplifier of the transmitter system in a frequency range. In some examples, the at least one transmission requirement includes standards requirement according to 5G New Radio (NR) specification. In some examples, the gain mask processing module is configured to generate a gain compensated signal, and the targeted filtered signal generating module is configured to generate the targeted filtered signal ($Y_{out}$) by applying the signal filter on the gain compensated signal. In some examples, the targeted filtered signal generating module is configured to generate the targeted filtered signal ($Y_{out}$) by reducing gain of the gain compensated signal except at desired frequency components of the gain compensated signal, and the desired frequency components are determined based on the transmission requirement.

Also disclosed herein are methods for performing signal predistortion, including the embodiment of the method described in this paragraph. The method includes filtering, by an intermodulation distortion (IMD) filter module, a detected feedback signal ($Y_{in}$) to generate a targeted filtered signal ($Y_{out}$); updating, by a digital pre-distortion (DPD) coefficient estimation module, signal generation coefficients based on comparing an input signal ($S_{in}$) with the targeted filtered signal ($Y_{out}$); and generating, by a distortion compensation processing module, a pre-distorted signal ($U_{out}$) based on the input signal ($S_{in}$) using the updated signal generation coefficients.

In some examples, the method further includes generating, by a gain mask generating module of the IMD filter module, a gain mask based on at least one transmission measurement; applying, by a gain mask processing module of the IMD filter module, the gain mask to the detected feedback signal ($Y_{in}$); generating, by a filter design generating module of the IMD filter module, a signal filter based on at least one transmission requirement; and generating, by a targeted filtered signal generating module of the IMD filter module, the targeted filtered signal ($Y_{out}$) based on the signal filter.

In some examples, the at least one transmission measurement includes a gain response of an amplifier of the transmitter system in a frequency range. In some examples, the at least one transmission requirement includes standards requirement according to 5G New Radio (NR) specification. In some examples, the method includes generating, by the gain mask processing module, a gain compensated signal; and generating, by the targeted filtered signal generating module, the targeted filtered signal ($Y_{out}$) by applying the signal filter on the gain compensated signal. In some examples, the method includes generating, by the targeted filtered signal generating module, the targeted filtered signal ($Y_{out}$) by reducing gain of the gain compensated signal except at desired frequency components of the gain compensated signal. The desired frequency components may be determined based on the transmission requirement.

Also disclosed herein are embodiments of at least one non-transitory computer-readable medium, including the embodiment of the at least one non-transitory embodiment described in this paragraph, storing instructions therein which, when run on a processor, causes the processor to filter a detected feedback signal ($Y_{in}$) to generate a targeted filtered signal ($Y_{out}$); update signal generation coefficients based on comparing an input signal ($S_{in}$) with the targeted filtered signal ($Y_{out}$); and generate a pre-distorted signal ($U_{out}$) based on the input signal ($S_{in}$) using the updated signal generation coefficients.

In some examples, the instructions further cause the processor to generate a gain mask based on at least one transmission measurement; apply the gain mask to the detected feedback signal ($Y_{in}$); generate a signal filter based on at least one transmission requirement; and generate the targeted filtered signal ($Y_{out}$) based on the signal filter. In some examples, the at least one transmission measurement includes a gain response of an amplifier of the transmitter system in a frequency range. In some examples, the at least one transmission requirement includes standards requirement according to 5G New Radio (NR) specification.

In some examples, the instructions further cause the processor to generate a gain compensated signal; and generate the targeted filtered signal ($Y_{out}$) by applying the signal filter on the gain compensated signal. In some examples, the instructions further cause the processor to generate the targeted filtered signal ($Y_{out}$) by reducing gain of the gain compensated signal except at desired frequency components of the gain compensated signal. The desired frequency components may be determined based on the transmission requirement.

Also disclosed herein are transmitter systems, including the embodiment of the system described in this paragraph, each with a signal decomposition module configured to extract a low-frequency signal ($S_{lo}$) and a high-frequency signal ($S_{hi}$) from an input signal ($S_{in}$); a distortion compensation processing module configured to generate a pre-distorted low-frequency signal ($U_{lo}$) and a pre-distorted high-frequency signal ($U_{hi}$) based on the low-frequency signal ($S_{lo}$) and the high-frequency signal ($S_{hi}$) using signal generation coefficients; a signal combining module configured to combine the pre-distorted low-frequency signal ($U_{lo}$) and the pre-distorted high-frequency signal ($U_{hi}$); an intermodulation distortion (IMD) filter module configured to filter a detected low-frequency feedback signal ($Y_{lo}$) to generate a targeted low-frequency filtered signal ($Y_{lo}'$) and filter a detected high-frequency feedback signal ($Y_{hi}$) to generate a targeted high-frequency filtered signal ($Y_{hi}'$); and a signal characteristic estimation processing module configured to update the signal generation coefficients used by the distortion compensation processing module based on comparing the low-frequency signal ($S_{lo}$) and the high-frequency signal ($S_{hi}$) with the targeted low-frequency filtered signal ($Y_{lo}'$) and the targeted high-frequency filtered signal ($Y_{hi}'$).

In some examples, the detected feedback low-frequency signal ($Y_{lo}$) is obtained by demodulating an output signal ($S_{out}$) of the system at a first frequency (Fl) and the detected feedback high-frequency signal ($Y_{hi}$) is obtained by demodulating the output signal ($S_{out}$) at a second frequency (Fh) different from the first frequency value. In some examples, the IMD filter module includes a low-frequency IMD filter module and a high-frequency IMD filter module. Each of these IMD filter modules includes a gain mask generating module configured to generate a gain mask based on at least one transmission measurement; a gain mask processing module configured to apply the gain mask to the detected feedback signal ($Y_{in}$); a filter design generating module configured to generate a signal filter based on at least one transmission requirement; and a targeted filtered signal generating module configured to generate the targeted high-frequency or low-frequency filtered signal ($Y_{lo}'$ or $Y_{hi}'$) based on the signal filter.

Also disclosed herein are methods for performing signal predistortion, including the embodiment of the method described in this paragraph, where each method includes extracting, by a signal decomposition module, a low-frequency signal ($S_{lo}$) and a high-frequency signal ($S_{hi}$) from an input signal ($S_{in}$); generating, by a distortion compensation processing module, a pre-distorted low-frequency signal ($U_{lo}$) and a pre-distorted high-frequency signal ($U_{hi}$) based on the low-frequency signal ($S_{lo}$) and the high-frequency signal ($S_{hi}$) using signal generation coefficients; combining, by a signal combining module, the pre-distorted low-frequency signal ($U_{lo}$) and the pre-distorted high-frequency signal ($U_{hi}$); filtering, by an intermodulation distortion filter module, a detected low-frequency feedback signal ($Y_{lo}$) to generate a targeted low-frequency filtered signal ($Y_{lo}'$) and filter a detected high-frequency feedback signal ($Y_{hi}$) to generate a targeted high-frequency filtered signal ($Y_{hi}'$); and updating, by a signal characteristic estimation processing module, the signal generation coefficients used by the distortion compensation processing module based on comparing the low-frequency signal ($S_{lo}$) and the high-frequency signal ($S_{hi}$) with the targeted low-frequency filtered signal ($Y_{lo}'$) and the targeted high-frequency filtered signal ($Y_{hi}'$).

In some examples, the method includes generating the detected feedback low-frequency signal ($Y_{lo}$) by demodulating an output signal ($S_{out}$) of the system at a first frequency (Fl); and generating the detected feedback high-frequency signal ($Y_{hi}$) by demodulating the output signal ($S_{out}$) at a second frequency (Fh) different from the first frequency value. In some examples, the method includes generating, by a gain mask generating module of the IMD filter module, a low-frequency gain mask and a high-frequency gain mask based on at least one transmission measurement; applying, by a gain mask processing module of the IMD filter module, the low-frequency and high-frequency gain masks to the detected feedback signal ($Y_{in}$); generating, by a filter design generating module of the IMD filter module, a low-frequency signal filter and a high-frequency signal filter based on at least one transmission requirement; and generating, by a targeted filtered signal generating module of the IMD filter module, the targeted low-frequency filtered signal ($Y_{lo}$) based on the low-frequency signal filter and the targeted high-frequency filtered signal ($Y_{hi}$) based on the high-frequency signal filter.

Also disclosed herein are embodiments of at least one non-transitory computer-readable medium, including the embodiment of the at least one non-transitory embodiment described in this paragraph, storing instructions therein which, when run on a processor, causes the processor to extract a low-frequency signal ($S_{lo}$) and a high-frequency signal ($S_{hi}$) from an input signal ($S_{in}$); generate a pre-distorted low-frequency signal ($U_{lo}$) and a pre-distorted high-frequency signal ($U_{hi}$) based on the low-frequency signal ($S_{lo}$) and the high-frequency signal ($S_{hi}$) using signal generation coefficients; combine the pre-distorted low-frequency signal ($U_{lo}$) and the pre-distorted high-frequency signal ($U_{hi}$); filter a detected low-frequency feedback signal ($Y_{lo}$) to generate a targeted low-frequency filtered signal ($Y_{lo}'$) and filter a detected high-frequency feedback signal ($Y_{hi}$) to generate a targeted high-frequency filtered signal ($Y_{hi}'$); and update the signal generation coefficients used by the distortion compensation processing module based on comparing the low-frequency signal ($S_{lo}$) and the high-frequency signal ($S_{hi}$) with the targeted low-frequency filtered signal ($Y_{lo}'$) and the targeted high-frequency filtered signal ($Y_{hi}'$).

In some examples, the instructions further cause the processor to generate the detected feedback low-frequency signal ($Y_{lo}$) by demodulating an output signal ($S_{out}$) of the system at a first frequency (Fl); and generate the detected feedback high-frequency signal ($Y_{hi}$) by demodulating the output signal ($S_{out}$) at a second frequency (Fh) different from the first frequency value. In some examples, the instructions further cause the processor to generate a low-frequency gain mask and a high-frequency gain mask based on at least one transmission measurement; apply the low-frequency and high-frequency gain masks to the detected feedback signal ($Y_{in}$); generate a low-frequency signal filter and a high-frequency signal filter based on at least one transmission requirement; and generate the targeted low-frequency filtered signal ($Y_{lo}$) based on the low-frequency signal filter and the targeted high-frequency filtered signal ($Y_{hi}$) based on the high-frequency signal filter.

While multiple embodiments are disclosed, still other embodiments of the present disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

The embodiments will be more readily understood in view of the following description when accompanied by the below figures and wherein like reference numerals represent like elements. These depicted embodiments are to be understood as illustrative of the disclosure and not as limiting in any way.

FIG. 1 shows a prior-art signal transmission system with a distortion compensation device as known in the art.

FIG. 4 shows a signal transmission device with distortion compensation functionality, according to the embodiments disclosed herein.

FIG. 5 shows a process of performing signal transmission with distortion compensation having targeted spectrum emission, according to the embodiments disclosed herein.

FIG. 6 shows a process of performing dual-band signal transmission with distortion compensation having targeted spectrum emission, according to the embodiments disclosed herein.

FIG. 9 shows an exemplary filtering result for FCC spectrum emission spec in 5G NR100 signal, according to the embodiments disclosed herein.

Figure 2A:
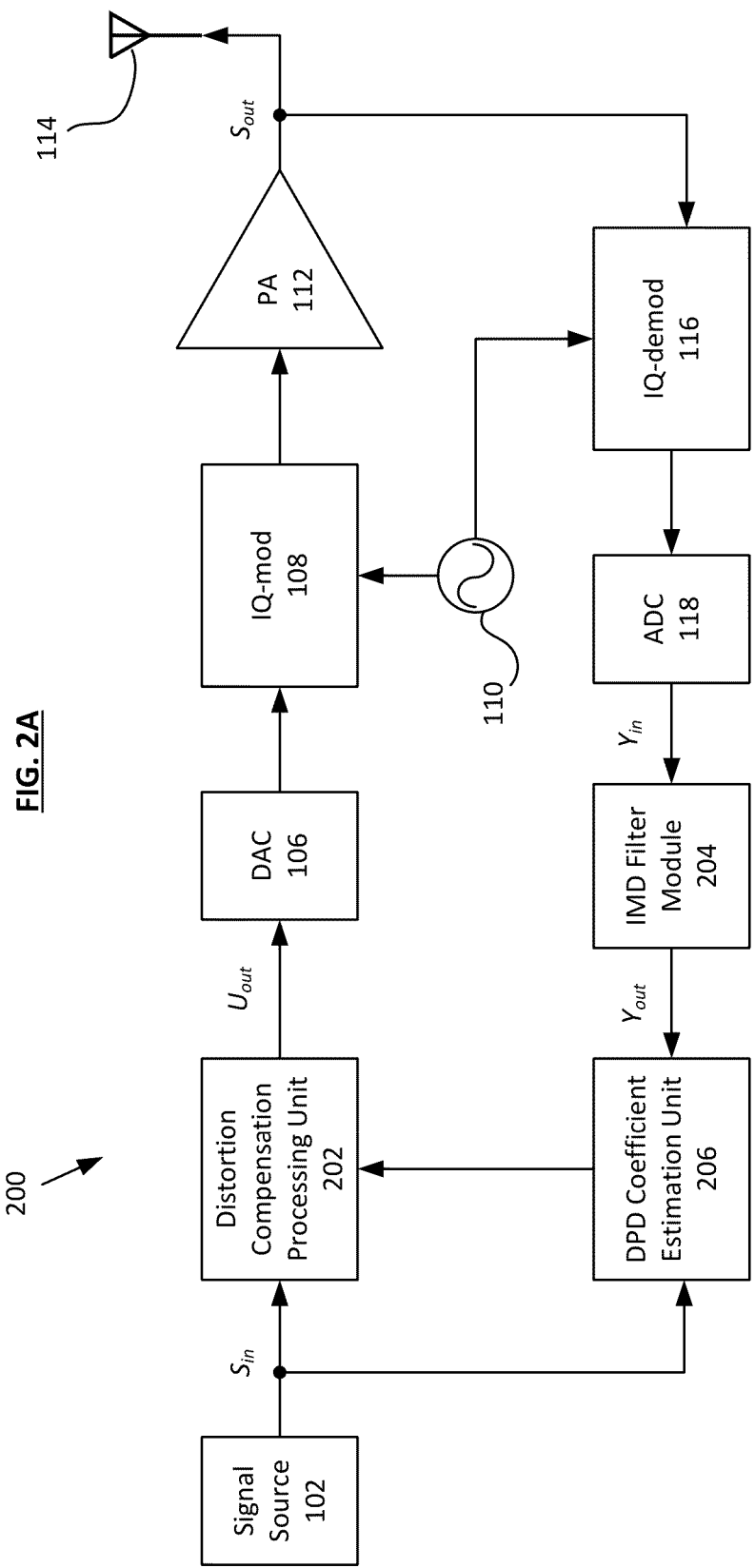
FIG. 2A shows a signal transmission system with distortion compensation functionality having targeted spectrum emission, according to the embodiments disclosed herein.

While the present disclosure is amenable to various modifications and alternative forms, specific embodiments have been shown by way of example in the drawings and are described in detail below. The intention, however, is not to limit the present disclosure to the particular embodiments described. On the contrary, the present disclosure is intended to cover all modifications, equivalents, and alternatives falling within the scope of the present disclosure as defined by the appended claims.

DETAILED DESCRIPTION OF THE DISCLOSURE

In the following detailed description, reference is made to the accompanying drawings which form a part hereof, and in which is shown by way of illustration specific embodiments in which the present disclosure is practiced. These embodiments are described in sufficient detail to enable those skilled in the art to practice the present disclosure, and it is to be understood that other embodiments can be utilized and that structural changes can be made without departing from the scope of the present disclosure. Therefore, the following detailed description is not to be taken in a limiting sense, and the scope of the present disclosure is defined by the appended claims and their equivalents.

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments. Furthermore, the described features, structures, or characteristics of the subject matter described herein may be combined in any suitable manner in one or more embodiments.

With respect to terminology of inexactitude, the terms "about" and "approximately" may be used, interchangeably, to refer to a measurement that includes the stated measurement and that also includes any measurements that are reasonably close to the stated measurement. Measurements that are reasonably close to the stated measurement deviate from the stated measurement by a reasonably small amount as understood and readily ascertained by individuals having ordinary skill in the relevant arts. Such deviations may be attributable to measurement error, differences in measurement and/or manufacturing equipment calibration, human error in reading and/or setting measurements, minor adjustments made to optimize performance and/or structural parameters in view of differences in measurements associated with other components, particular implementation scenarios, imprecise adjustment and/or manipulation of objects by a person or machine, and/or the like, for example. In the event it is determined that individuals having ordinary skill in the relevant arts would not readily ascertain values for such reasonably small differences, the terms "about" and "approximately" can be understood to mean plus or minus 10% of the stated value.

Implementation 1

FIG. 2A illustrates an example of a signal transmission device or system 200 as disclosed herein for performing digital predistortion (DPD) for distortion compensation of the PA 112. It is to be understood that in some examples, each of the functional blocks in the figures may be implemented as an individual component, or a plurality of functional blocks may be implemented together in a component, as suitable for designing, manufacturing, or operating the device or system. The system 200 includes a distortion compensation processing unit 202 which applies distortion compensation on an input signal ($S_{in}$) provided from the signal source 102 to generate a distortion-compensated digital output signal $U_{out}$ to be converted into analog signal using the DAC 106, after which the analog signal is upconverted using the IQ modulator 108 at a carrier frequency determined by the oscillator 110 and subsequently fed to the PA 112 to be outputted as the output signal $S_{out}$. In a feedback loop, the output signal $S_{out}$ is down-converted using the IQ demodulator 116 using the same carrier frequency, and the result of which is converted to an input digital output feedback signal $Y_{in}$ by the ADC 118.

In the feedback loop comprising the IQ demodulator 116, ADC 118, the IMD filter module 204, and the DPD coefficient estimation unit 206, the output signal $S_{out}$ is demodulated using the IQ demodulator 116 using the same frequency supplied to the IQ modulator 108. The input signal $Y_{in}$ is generated by passing the demodulated signal through the ADC 118, which is then provided as an input for an intermodulation distortions (IMD) filter module 204, the output of which is a gain-compensated output signal $Y_{out}$. The IMD filter 204 operates to filter the IMD or spectrum emission of the input signal such that only the desired portion of the IMD or spectrum emission is included, while the other portions are left out or eliminated in order to reduce the adjacent channel power ratio (ACPR), which is the ratio between the total power of adjacent channel (the intermodulation signal) to the main channel's power (the useful signal). A high ACPR indicates that significant spectral spreading has occurred, therefore the ACPR is preferred to remain as low as possible. Typically, third-order intermodulation products (that is, third-order IMD) are the result of nonlinear behavior of an amplifier; as such, it is desired to correct the third-order IMD without, for example, affecting another nearby emission.

Figure 7B:
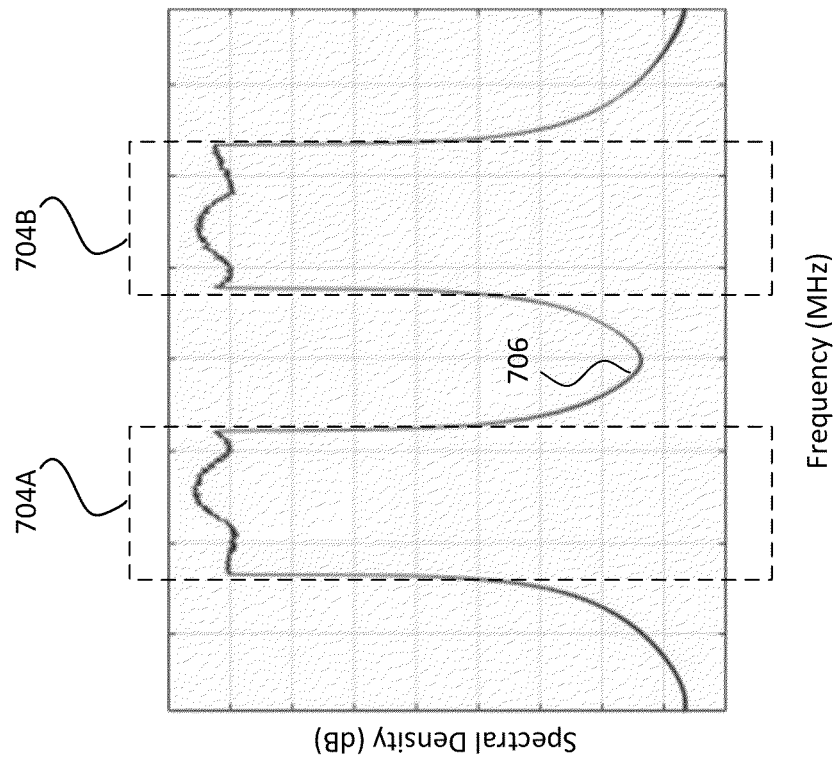
FIG. 7B shows a spectrum plot of an error signal that is filtered out and leaving only the desired frequency components, according to the embodiments disclosed herein.
Figure 7A:
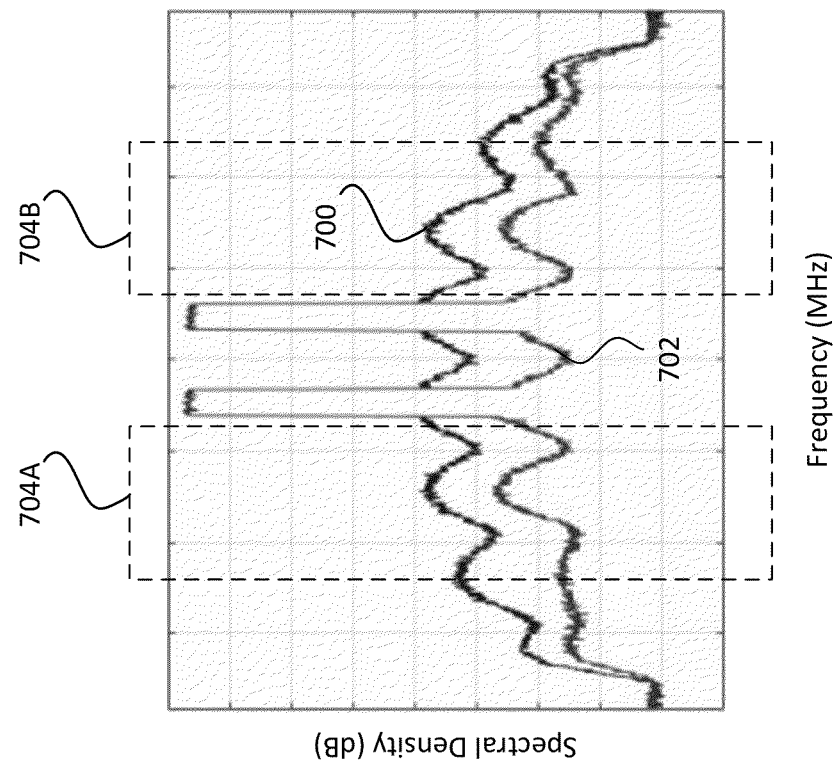
FIG. 7A shows a spectrum plot of uncorrected and initially corrected targeted intermodulation distortions (IMD) or spectrum emissions, according to the embodiments disclosed herein.

FIGS. 7A and 7B illustrate an example of the desired effect of such filter according to some implementations. In FIG. 7A, an IMD filter is applied to lower the spectral density of a spectrum emission at portions other than the desired ranges of frequency. For example, the plot compares an original uncorrected spectrum 700 with a partially-filtered spectrum 702 of the original spectrum. The transmitted signal has two component carriers with wideband spacing, and the desired frequency ranges 704A and 704B are determined based on the frequencies of the component carriers. In some examples, the difference between the ranges 704A and 704B may be at least approximately 10 MHz, at least approximately 20 MHz, at least approximately 30 MHz, at least approximately 40 MHz, at least approximately 50 MHz, at least approximately 100 MHz, or any other suitable value or range therebetween. In some examples, the ranges 704A and 704B themselves may span at least approximately 10 MHz, at least approximately 20 MHz, at least approximately 30 MHz, at least approximately 40 MHz, at least approximately 50 MHz, at least approximately 100 MHz, or any other suitable value or range therebetween.

The partially-filtered spectrum 702 is the result of applying spectrum filtering to the original spectrum 700 in its early stage of DPD iteration. That is, as the number of iterations of DPD increases, at a later stage of DPD iteration, the undesired portions of the signals are filtered out, leaving only the desired frequency components. The filtered signal 706 after a number of DPD iterations is shown in FIG. 7B, where it is observed that the peak spectral densities located between the desired frequency ranges 704A and 704B, as shown in FIG. 7A, is reduced, and the spectral density of the spectrum within the desired frequency ranges 704A and 704B are increased, as shown in FIG. 7B.

Referring back to FIG. 2A, the output signal $Y_{out}$ from the IMD filter module 204 is provided to the DPD coefficient estimation unit 206 to update the coefficients for distortion compensation. The coefficient estimation is performed by the DPD coefficient estimation unit 206 (or more specifically, the processing unit thereof) by comparing the input signal $S_{in}$ with the obtained output signal $Y_{out}$, based on which the DPD coefficient estimation unit 206 updates the coefficients to reduce the difference (error, or distortion caused by the PA) between the obtained output signal $Y_{out}$ and the input signal $S_{in}$. The coefficients are then applied to a polynomial model as known in the art to generate the predistorted output signal $U_{out}$.

Discussed below is an exemplary implementation of the subject disclosure according to some embodiments as disclosed herein. Based on a generalized polynomial model indicated in Lei et al, "A Robust Digital Baseband Predistorter Constructed Using Memory Polynomials," *IEEE Transactions on Communications*, 52(1), p.159-165, in some examples, the predistorted output signal may be generated using the following form:

$$y(n) = \sum_{l=0}^{L-1} x(n-l) \sum_{m=-M_1}^{M_2} b_{lm} \sum_{k=0}^{K} a_{mk} |x(n-l-m)|^{2k} \quad \text{(Equation 1)}$$

where L is the memory depth, K is the highest nonlinearity order, $M_1$ is backward cross term length, $M_2$ is forward cross term length, and $a_{mk}$ and $b_{lm}$ are the signal generation coefficients which are updated according to compensate for the distortion caused by the PA. Thus, for example, in the system depicted in FIG. 2A, y(n) and x(n) may correspond to $U_{out}$ and $S_{in}$, respectively. The coefficients may be collected or provided in a matrix or a table stored in the memory, which is utilized by the processor for calculating the predistorted signal using the above equation.

Figure 2B:
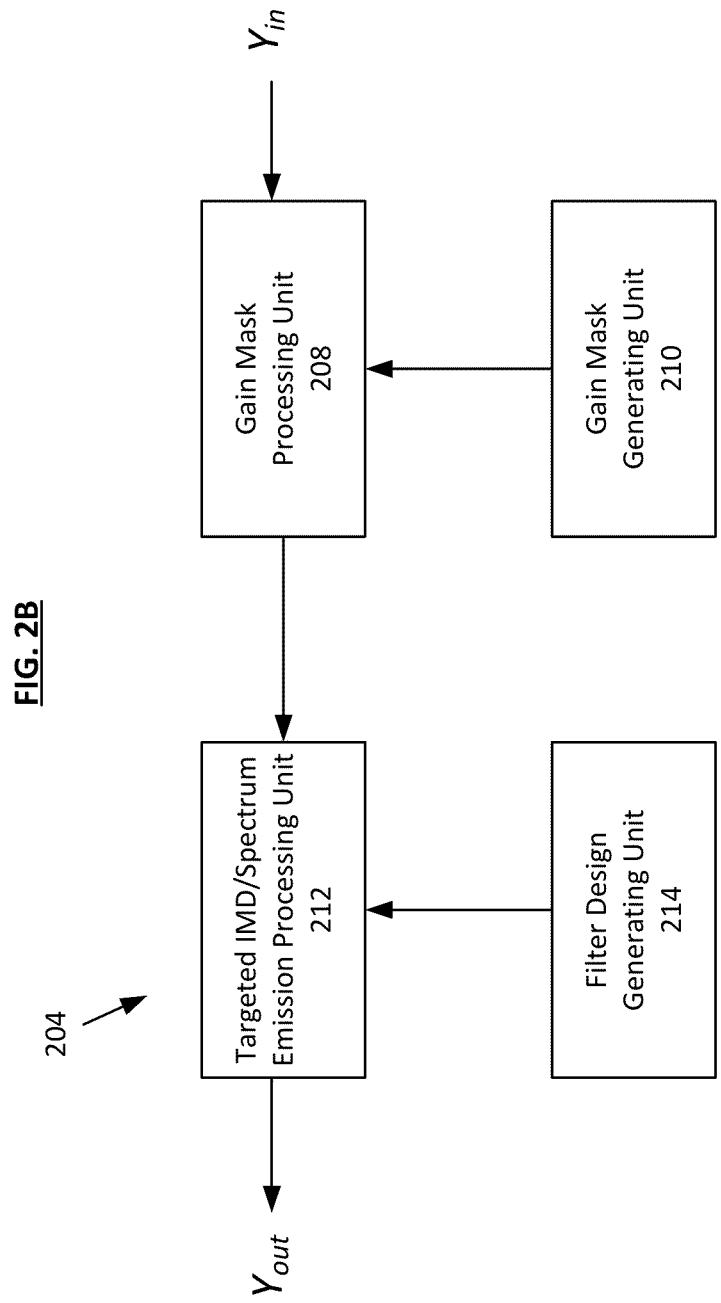
FIG. 2B shows exemplary subcomponents of a filter module of FIG. 2A according to the embodiments disclosed herein.

FIG. 2B shows the exemplary subcomponents of the IMD filter module 204 according to some embodiments. The module 204 includes four components: a gain mask processing unit 208, a gain mask generating unit 210, a targeted IMD/spectrum emission processing unit 212, and a filter design generating unit 214. Each of these components may be implemented using a separate processing unit, or alternatively, two or more of the components may be implemented using the same processing unit.

The gain mask generating unit 210 generates a gain mask which is to be applied to the input of the IMD filter module 204, i.e. the input feedback signal $Y_{in}$. The configuration of the gain mask may be determined by measurements such as the gain response of the PA 112 in specific frequency ranges. For example, the frequency range may be the ranges 704A and 704B as shown in FIG. 7A such that the generated mask is configured to affect those frequency ranges, as determined from the PA gain response measurements.

The gain response of the PA 112 may be measured using any suitable standard network analyzer as known in the art, for example, which compares the input and the output of the PA to determine its state of gain-over-frequency as well as its phase. The standard network analyzer may be implemented as a separate equipment from the gain mask generation unit 210 and is functionally coupled with the PA 112 to take the aforementioned measurements, as suitable. The measurements pertaining to the PA gain response may be then transmitted to the gain mask generation unit 210 for suitable gain mask generation.

Typically, the PA 112 meets the gain specification within the predetermined transmission band, but the gain can drop rapidly once outside the transmission band. The DPD may typically require a multiple of the carrier bandwidth (for example, five times the carrier bandwidth), in which case it is desirable for the gain slope of the frequency portion that is outside the transmission band to be compensated by the gain mask processing unit 208. Specifically, the gain mask processing unit 208 may receive the gain mask generated by the gain mask generating unit 210 using the aforementioned process, then perform gain compensation on the received input feedback signal $Y_{in}$ (for example, from the ADC 118) based on the gain mask. In some examples, the resulting gain-compensated signal may then be sent to the targeted IMD/spectrum emission processing unit 212 which filters out all but the desired frequency components. Such filtering may occur in the later stage of DPD iterations. The filter used by the targeted IMD/spectrum emission processing unit 212 is generated by the filter design generating unit 214 which may generate the filter based on requirement and other factors. For example, the requirement may involve predetermined threshold frequencies or frequency ranges as determined by Third Generation Partnership Project (3GPP) systems and systems that may employ one or more aspects of the specifications of Third Generation (3G), Fourth Generation (4G), Fifth Generation (5G), or any subsequent generation standard for wireless communications as would be familiar with those skilled in the art.

Figure 8:
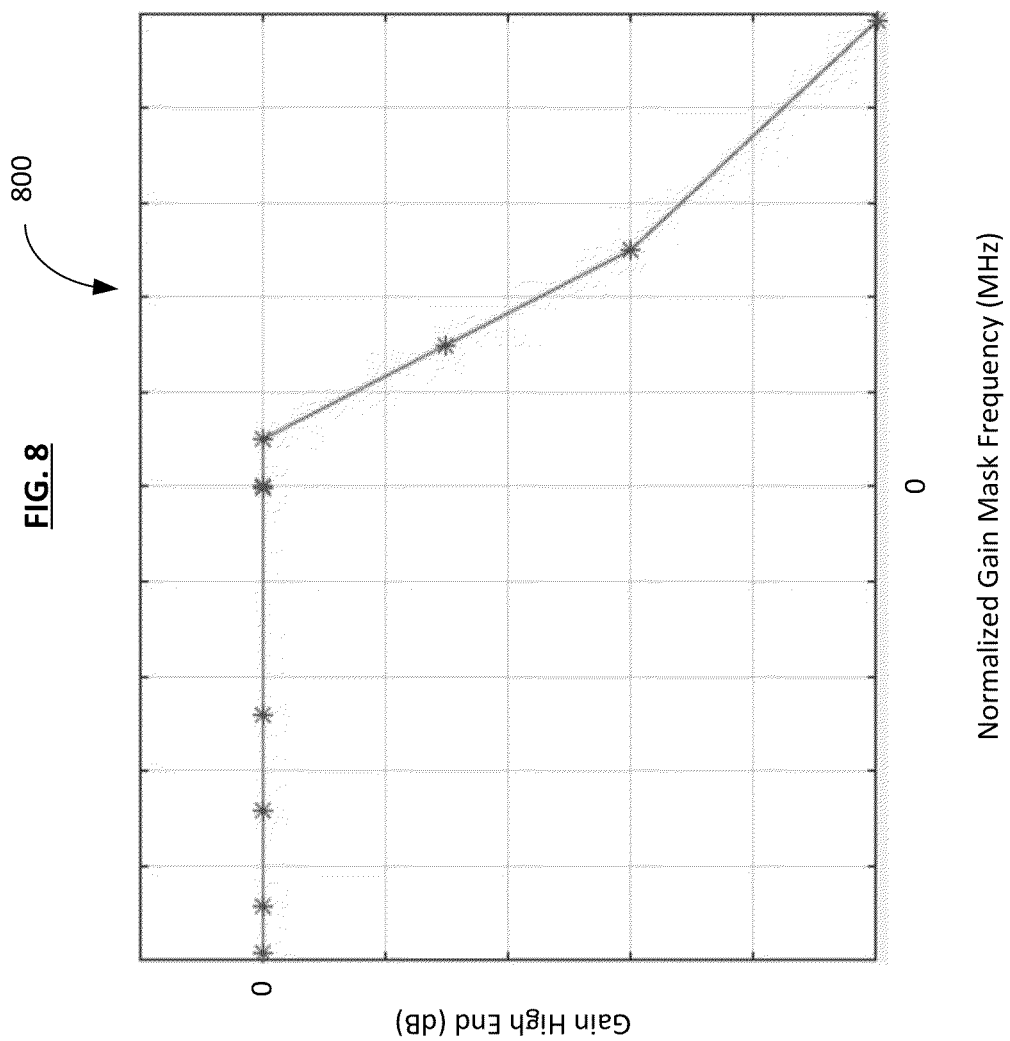
FIG. 8 shows an exemplary gain mask for preprocessing feedback data, according to the embodiments disclosed herein.

FIG. 8 shows an exemplary normalized gain mask 800 for preprocessing feedback data signal $Y_{in}$ according to some implementations. The high end of the gain mask 800 as normalized is centered at a frequency of 0 Hz, but it should be understood that the high end of the gain mask 800 may be centered around any suitable threshold frequency (for example, between approximately 1800 MHz and 4 GHz, etc., or any other frequency range or value therebetween) as determined by the system, based on the required masking that is to be implemented in view of measurements such as the PA gain response, for example. In the gain mask 800, the gain high end is at a determined threshold frequency, which indicates the gain is unaltered until at least the threshold frequency is reached, beyond which the gain decreases to negative decibels as shown. The decline slope of the gain decrease beyond the central frequency may be determined according to the measurements taken, for example approximately -1 dB, approximately -2 dB, approximately -3 dB, approximately -4 dB, approximately -5 dB, or any other suitable value therebetween, for every 100 MHz. In some examples, the specific value of the high end frequency may be chosen from: 1880 MHz, 2170 MHz, 3800 MHz, or 3980 MHz.

It should be understood that another gain slope may exist at a low end of the gain mask, only reversed in the opposite direction from the high end as shown in the figure. For example, the gain low end may be centered around any suitable threshold frequency (for example, between approximately 1800 MHz and 4 GHz, etc., or any other frequency range or value therebetween) that is lower than the threshold frequency of the gain high end. As the frequency increases, the gain reduction decreases until it reaches 0 dB, and beyond the threshold frequency, the gain remains unaltered at 0 dB. The incline slope of the gain until the frequency reaches the threshold frequency may be determined according to the measurements taken, for example approximately 1 dB, approximately 2 dB, approximately 3 dB, approximately 4 dB, approximately 5 dB, or any other suitable value therebetween, for every 100 MHz. In some examples, the specific value of the low end frequency may be chosen from: 1805 MHz, 2110 MHz, 3400 MHz, or 3700 MHz.

FIG. 9 shows a resulting signal 902 after applying an exemplary filter as generated by the filter design generation unit 214 to a feedback signal 900 from the amplifier, according to some implementations. The wireless communication may be subject to be complaint to any one of the standards with different requirements, such as the Federal Communications Commission (FCC) and the Institute of Electrical and Electronics Engineers (IEEE), to name a few. Particularly, the filter as shown is designed to meet compliance requirement for FCC spectrum emission specification for 5G New Radio (NR) standard signal, for example, such that the close-in spectrum emission can be corrected. The filter is configured to remove all frequency components except for the desired frequency locations, resulting in the signal with filtered spectrum emission, as shown in 902. The bandwidth surrounding each of the peak-amplitude frequencies in the filtered signal may be any suitable value, for example approximately 5 MHz, 10 MHz, 15 MHz, 20 MHz, or any other suitable value or range therebetween.

Referring back to FIG. 4, the block diagram shows an example of the signal transmission system 200 according to embodiments disclosed herein. Each of the individual blocks or modules as explained with respect to the signal transmission system 200 may be implemented as at least one processing unit 400 coupled with a memory unit 402 which stores thereon program codes 404 to be executed by the processing unit or processor 400. In some examples, each block or module may be implemented using a single processor or a set of processor operating together. In some examples, multiple blocks or modules may be implemented using a single processor or a set of processors operating together. The processing unit or processor may be any suitable means of processing data inputs, including but not limited to a central processing unit (CPU) of a computing device, a virtual CPU of a virtual machine, a multicore CPU, a system on a chip (SoC), etc. The processor may be a programmable processing or micro-processing device of a solid-state, integrated circuit type that includes one or more processing units and memory. Processors can include one or more Arithmetic Logic Units (ALUs), CPUs, memory devices, and/or different circuitry or functional components, etc., as would occur to those skilled in the art to perform the desired implementations. The processor may be communicatively coupled with an external device such as a user device (including but not limited to desktop or laptop computer, smartphone, personal digital assistant, tablet computer, etc.) via any suitable means of digital communications including but not limited to the Internet, a cloud computing network, or a personal area network such as WLAN/WPAN connectivity, either via wired or wireless communications. In some examples, there may be a plurality of processors which are functionally coupled together and therefore operate together.

The memory unit 402 may be any suitable means of non-transitory computer-readable storage medium which can be local, remote, or distributed. The memory may include, among others, random access memory (RAM), such as dynamic RAM (DRAM) and static RAM (SRAM), for example. The memory may also be a non-volatile storage such as a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software on the computer system. The memory may also store the software or computer program codes 404 which, when executed by the processor 400, perform the methods, processes, and/or algorithms as disclosed herein.

FIG. 5 shows an example of a process 500 performed by the processor 400 according to embodiments disclosed herein. The process 500 may be performed by the processor 400 when the instructions or program codes 404 stored on the non-transitory computer-readable medium or the memory unit 402 are run on the processor 400. The process 500 includes the processor filtering the detected feedback signal ($Y_{in}$) to generate a targeted filtered signal ($Y_{out}$) in step 502. The processor then updates the signal generation coefficients based on the comparison between the input signal ($S_{in}$) and the targeted filtered signal ($Y_{out}$) in step 504. Then, the processor generates the predistorted signal ($U_{out}$) based on the input signal ($S_{in}$) using the updated signal generation coefficients in step 506 to be outputted via the transmitter. As explained herein, step 502 may be performed by the IMD filter module 204 of the processor, step 504 may be performed by the DPD coefficient estimation module 206 of the processor, and step 506 may be performed by the distortion compensation processing module 202 of the processor, for example. Alternatively, these modules may be implemented as a single device or component or as any other suitable number of components.

In some examples, the process 500 further involves the processor, or in some examples the gain mask generating module 210 of the IMD filter module 204, to generate a gain mask based on at least one transmission measurement. The process 500 may also involve the processor, in some examples the gain mask processing module 208 of the IMD filter module 204, to apply the gain mask to the detected feedback signal ($Y_{in}$). Subsequently, the processor, or in some examples the filter design generation module 214 of the IMD filter module 204, generates a signal filter based on at least one transmission requirement. Then, the processor, or in some examples the targeted filtered signal generating module 212 of the IMD filter module 204, generates the targeted filtered signal ($Y_{out}$) based on the generated signal filter.

In some examples, the gain mask is generated during the process 500 based on at least one measurement of a gain response of an amplifier of the transmitter system in a frequency range. In some examples, transmission requirement are determined based on or according to the standards requirement for Long-Term Evolution (LTE), 3G, 4G, or 5G New Radio (NR) specification, among others. In some examples, the standards requirement of any other suitable radio access technology for a telecommunication network as known in the art.

In some examples, the process 500 includes causing the processor, or in some examples the gain mask processing module 208, to generate a gain compensated signal, and the processor, or in some examples the targeted filtered signal generating module 212, generates the targeted filtered signal ($Y_{out}$) by applying the signal filter on the gain compensated signal. In some examples, the processor, or in some examples the targeted filtered signal generating module 212, generates the targeted filtered signal ($Y_{out}$) by reducing gain of the gain compensated signal except at desired frequency components of the gain compensated signal. The desired frequency components may be determined based on the transmission requirement, such as those of the standards requirement for any suitable radio access technology specification.

Advantages of implementing the signal transmission device or system as disclosed herein include the ability for the system to incorporate additional adjustments to the feedback signal (that is, $Y_{in}$) to provide the gain compensation before using the gain-compensated feedback signal (that is, $Y_{out}$) to update the signal generation coefficients for generating the predistorted signal (that is, $U_{out}$) to be used for transmission. The adjustments enabled by the gain mask and the signal filter may be implemented for different purposes. For example, the gain mask is used to compensate for the distortions caused by the PA gain response, and the signal filter is used to meet the transmission requirements as determined by the 3GPP, such as LTE, 3G, 4G, 5G, etc. Furthermore, the additional adjustments further improve the accuracy of the updated coefficients based on which the next predistorted signal is generated, such that there is less distortion in the final transmitted signal (that is, $S_{out}$).

Implementation 2

Figure 3:
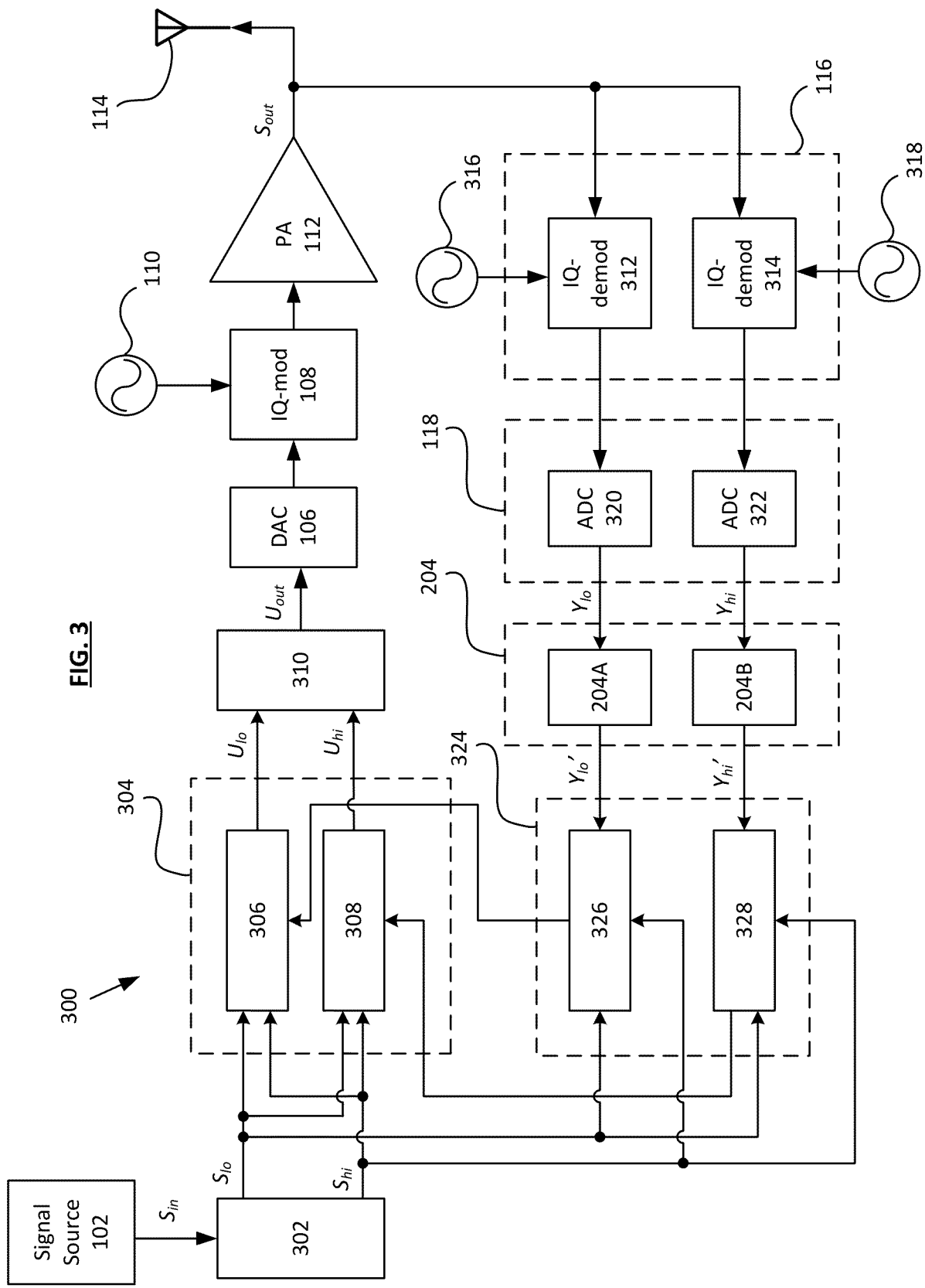
FIG. 3 shows a dual-band signal transmission system with distortion compensation functionality having targeted spectrum emission, according to the embodiments disclosed herein.

FIG. 3 illustrates an example of a signal transmission device or system 300 as disclosed herein for performing DPD. It is to be understood that in some examples, each of the functional blocks in the figures may be implemented as an individual component, or a plurality of functional blocks may be implemented together in a component, as suitable for designing, manufacturing, or operating the device or system. The system 300 includes a signal decomposition module 302 which extracts a low-frequency signal ($S_{lo}$) and a high-frequency signal ($S_{hi}$) from an input signal ($S_{in}$) provided from the signal source 102. The signal extraction is based on extracting only a portion of the input signal, where the portion of the signal to be extracted is determined based on two different and separate carrier frequencies. Any suitable method of signal extraction may be implemented, including but not limited to linear filtering. For example, the carrier frequency for each of the low-frequency and high-frequency extractions may be determined based on the spectral density of the input signal, as further discussed herein. Examples of frequencies for the low-frequency signal ($S_{lo}$) and a high-frequency signal ($S_{hi}$) may be 1840 MHz and 2140 MHz, respectively.

The system 300 further includes a distortion compensation processing module 304 which generates a pre-distorted low-frequency signal ($U_{lo}$) and a pre-distorted high-frequency signal ($U_{hi}$) based on the received low-frequency and high-frequency signals using suitable signal generation coefficients generated by and provided from a signal characteristic estimation processing module 324. Examples of frequencies for the pre-distorted low-frequency signal ($U_{lo}$) and pre-distorted high-frequency signal ($U_{hi}$) may be 1840 MHz and 2140 MHz, respectively. The manner in which the pre-distorted low-frequency signal ($U_{lo}$) and pre-distorted high-frequency signal ($U_{hi}$) are generated is described herein and as follows.

In some examples, the pre-distorted signals $U_{lo}$ and $U_{hi}$ are generated separately and independently of each other. In the example shown, the distortion compensation processing module 304 includes a low-frequency distortion compensation processing module 306 and a high-frequency distortion compensation processing module 308. The low-frequency processing module 306 receives the decomposed input signals $S_{lo}$ and $S_{hi}$ as well as the low-frequency signal generation coefficients from the signal characteristic estimation processing module 324, as further disclosed herein, and based on these, the processing module 306 generates the pre-distorted signal $U_{lo}$. The frequency processing module 308 receives the decomposed input signals $S_{lo}$ and $S_{hi}$ as well as the high-frequency signal generation coefficients from the signal characteristic estimation processing module 324, and based on these, the processing module 308 generates the pre-distorted signal $U_{hi}$. When the pre-distorted signals are generated, they are combined using a signal combining module 310 which generates a combined pre-distorted output signal ($U_{out}$) by adding together the predistorted low-frequency and high-frequency signals ($U_{lo}$, $U_{hi}$). The pre-distorted output signal $U_{out}$ is converted using the DAC 106, upconverted using the IQ-modulator 108, and amplified using the PA 112, as known in the art and described above with respect to FIG. 1, to generate the output signal $S_{out}$ to be transmitted via the antenna 114.

In the feedback loop comprising the IQ demodulator 116, ADC 118, the IMD filter module 204, and the signal characteristic estimation processing module 324, the output signal $S_{out}$ is demodulated based on two different frequencies which are determined based on the frequencies implemented by the signal decomposition module 302. For example, a first IQ demodulator 312 uses a first frequency determined by an oscillator 316, and a second IQ demodulator 314 uses a second frequency determined by another oscillator 318. The frequency of the oscillator 316 is lower than the frequency of the oscillator 318, with examples of frequencies for the first and second oscillator frequencies being 1840 MHz and 2140 MHz, respectively. Thereafter the demodulated signal from the IQ demodulator 312 is converted using a first ADC 320 to generate a detected low-frequency feedback signal ($Y_{lo}$), and the demodulated signal from the IQ demodulator 314 is converted using a second ADC 322 to generate a detected high-frequency feedback signal ($Y_{hi}$). Examples of frequencies for the low-frequency feedback signal ($Y_{lo}$) and high-frequency feedback signal ($Y_{hi}$) would be 1840 MHz and 2140 MHz, respectively. Although the IQ demodulators 312 and 314 are illustrated as separate functional blocks, in some examples, the demodulation for both of the detected feedback signal $Y_{lo}$ and $Y_{hi}$ may instead be performed by a single IQ demodulator 116 to which the oscillators 316 and 318 are switchably coupled (in which case IQ demodulator 116 would only include one of IQ demodulators 312 or 314). Also, although the ADCs 320 and 322 are illustrated as separate functional blocks, in some examples, the analog-to-digital conversion of the low-frequency and high-frequency signals may instead be performed by a single ADC 118 to which the IQ demodulator 116 or IQ demodulators 312 and 314 are switchably coupled (in which case ADC 118 would only include one of ADCs 320 or 322).

The system 300 includes the IMD filter 204 operatively coupled with the output end of the ADC 118 or ADCs 320 and 322 to receive the output signals (that is, $Y_{lo}$ and $Y_{hi}$) from the ADC(s). Using the processes disclosed herein, the IMD filter 204 (or alternatively, in some examples, IMD filters 204A and 204B where each filter only handles the gain compensation of one of the low-frequency signal $Y_{lo}$ or the high-frequency signal $Y_{hi}$) generates a low-frequency gain-compensated feedback signal ($Y_{lo}'$) and a high-frequency gain-compensated feedback signal ($Y_{hi}'$).

The system 300 includes a signal characteristic estimation processing module 324 which generates the low-frequency and high-frequency signal generation coefficients used by the distortion compensation processing module 304 based on comparing the low-frequency decomposed input signal ($S_{lo}$) and the high-frequency decomposed input signal ($S_{hi}$) with the low-frequency gain-compensated feedback signal ($Y_{lo}'$) and the high-frequency gain-compensated feedback signal ($Y_{hi}'$), respectively. In some examples, the signal characteristic estimation processing module 324 may be a processing unit operating with a memory unit with a lookup table which stores therein the values for the low-frequency and high-frequency signal generation coefficients which may be updated or optimized during subsequent iterations of the cycle of outputting signal transmissions and analyzing the difference (or error margin) between the outputted signal and the initial signal during each iteration, thereby improving the accuracy of the signal characteristic estimation processing module 324. In some examples, the processing unit of the signal characteristic estimation processing module 324 may calculate the coefficients to be implemented for the subsequent cycle using any suitable instructions or algorithms that are configured to determine the updated coefficients in order to reduce the error margin between the input signal and the output signal. In some examples, the calculation may involve solving a normal equation based on a least-squares method, or any other suitable method as known in the art.

In some examples, the low-frequency and high-frequency signal generation coefficients are generated separately and independently of each other. In the example shown, the signal characteristic estimation processing module 324 includes a low-frequency signal characteristic estimation processing module 326 and a high-frequency signal characteristic estimation processing module 328. The low-frequency processing module 326 receives the decomposed input signals $S_{lo}$ and $S_{hi}$ as well as the low-frequency gain-compensated feedback signal ($Y_{lo}'$) and performs the comparison between the low-frequency gain-compensated feedback signal ($Y_{lo}'$) and the low-frequency decomposed input signal ($S_{lo}$), with the assistance from the high-frequency decomposed input signal ($S_{hi}$), to generate the low-frequency signal generation coefficients. The high-frequency processing module 328 receives the decomposed input signals $S_{lo}$ and $S_{hi}$ as well as the high-frequency gain-compensated feedback signal ($Y_{hi}'$) and performs the comparison between the high-frequency gain-compensated feedback signal ($Y_{hi}'$) and the high-frequency decomposed input signal ($S_{hi}$), with the assistance from the low-frequency decomposed input signal ($S_{lo}$), to generate the high-frequency signal generation coefficients. This is shown in Equations 4 and 5, as further discussed herein, used to calculate the predistorted signals, where the low-frequency predistorted signal $y_L(n)$ and the high-frequency predistorted signal $y_U(n)$ are both calculated using the low-frequency and high-frequency decomposed input signals, i.e. $x_L(n)$ and $x_U(n)$. The low-frequency and high-frequency signal generation coefficients are provided to the distortion compensation processing module 304 which uses them to generate the pre-distorted signals $U_{lo}$ and $U_{hi}$.

FIG. 6 shows an example of a process 600 performed by the processor 400 according to embodiments disclosed herein. The process 600 may be performed by the processor 400 when the instructions or program codes 404 stored on the non-transitory computer-readable medium or the memory unit 402 are run on the processor 400. The process 600 includes step 602 in which the processor extracts a low-frequency signal ($S_{lo}$) and a high-frequency signal ($S_{hi}$) from an input signal ($S_{in}$) provided by any suitable input signal source. For example, the processor 400 may perform these operations by incorporating and/or utilizing a signal decomposition module 302 as described above. The input signal $S_{in}$ is a composite signal with two component carriers (CC), where the power spectral density (PSD) of the input signal $S_{in}$ is normalized so as to be shifted so that the center of the bandwidth is located at the baseband (0 Hz). The bandwidth of the input signal $S_{in}$ is greater than the bandwidth of each of the two component carriers. The extraction process may involve determining the suitable carrier frequency for each of the signals $S_{lo}$ and $S_{hi}$ and then isolating the input signal at the two determined carrier frequencies to generate the signals $S_{lo}$ and $S_{hi}$. Each PSD of the extracted signals $S_{lo}$ and $S_{hi}$ is normalized, i.e. centered at the baseband (0 Hz), and each PSD of the extracted signals $S_{lo}$ and $S_{hi}$ may have a much smaller bandwidth than the original input signal $S_{in}$.

In step 604, the processor generates a pre-distorted low-frequency signal ($U_{lo}$) and a pre-distorted high-frequency signal ($U_{hi}$) based on the received low-frequency and high-frequency signals $S_{lo}$ and $S_{hi}$ using signal generation coefficients. For example, the processor 400 may perform these operations by incorporating and/or utilizing a distortion compensation processing module 304 (which in turn may include a low-frequency distortion compensation processing module 306 and a high-frequency distortion compensation processing module 308) as described above. In this case, the signal generation coefficients may have been previously determined during a prior feedback loop as further explained herein, or the coefficients may be predetermined, such as a set of "default" coefficients that are provided for the initial cycle and thereafter updated according to the measured distortion caused by the power amplifier, as further explained herein.

In step 606, the processor combines the pre-distorted low-frequency signal ($U_{lo}$) and the pre-distorted high-frequency signal ($U_{hi}$) to generate a combined pre-distorted output signal ($U_{out}$). For example, the processor 400 may perform this operation by incorporating and/or utilizing a signal combining module 310 as described above. The combined output signal $U_{out}$ is fed by the processor 400 to the DAC to be converted into an analog signal, to the IQ modulator to be upconverted using a carrier frequency "$F_c$", and then to the power amplifier, as previously explained, to be transmitted as an output signal $S_{out}$ by any suitable transmitter. The output signal $S_{out}$ includes distortions caused by the non-linear characteristics of the power amplifier using any suitable transmission format as known in the art, including but not limited to code-division multiple access (CDMA) and orthogonal frequency-division multiplexing (OFDM), which may be vulnerable to PA nonlinearities due to the high peak-to-average power ratio, corresponding to large fluctuations in signal envelopes.

In the feedback loop implemented to compensate for the distortions, the processor, in step 608, filters the low-frequency detected feedback signal ($Y_{lo}$) to generate the targeted or gain-compensated low-frequency filtered signal ($Y_{lo}'$) and also filters the high-frequency detected feedback signal ($Y_{hi}$) to generate the targeted or gain-compensated high-frequency filtered signal ($Y_{hi}'$).

Subsequently, in step 610, the processor updates the signal generation coefficients used in step 604 based on comparing the low-frequency signal ($S_{lo}$) and the high-frequency signal ($S_{hi}$) with the low-frequency gain-compensated feedback signal ($Y_{lo}'$) and the high-frequency gain-compensated feedback signal ($Y_{hi}'$). For example, the processor 400 may perform these operations by incorporating and/or utilizing a signal characteristic estimation processing module 324 (which in turn may include a low-frequency signal characteristic estimation processing module 326 and a high-frequency signal characteristic estimation processing module 328) as described above. The detected feedback signals $Y_{lo}$ and $Y_{hi}$ may be provided by down-converting the output signal $S_{out}$ using IQ demodulators using two different component carrier center frequencies (for example, a component carrier center frequency "$F_1$" for the lower-frequency signal $Y_{lo}$ and another component carrier center frequency "$F_h$" for the high-frequency signal $Y_{hi}$) after which the down-converted signal is converted to digital signal via the ADC. The carrier frequencies $F_1$ and $F_h$ may be related to the carrier frequency $F_c$ via the following formula: $F_c = (F_1 + F_h) / 2$.

The difference between the central carrier frequency $F_c$ and either of the frequency $F_l$ or $F_h$ is expressed as "X" such that when the input signal $S_{in}$ is centered at the baseband of 0 Hz, the low-frequency component carrier is located at -X Hz, and the high-frequency component carrier is located at X Hz; thus, the distance between the frequencies of the two component carriers is 2*X (also referred to as a wideband spacing between the two component carriers), and therefore the bandwidth of the input signal $S_{in}$ is greater than 2*X. In some examples, if the value of X = 100 MHz, the bandwidth of $S_{in}$ may be approximately 250 MHz. As such, the bandwidth of each of the extracted signals is less than the bandwidth of the original signal. In the above example where X = 100 MHz, the bandwidth of each of the extracted signals may be approximately 5 MHz, 10 MHz, 20 MHz, 30 MHz, 50 MHz, or any other suitable value therebetween, for example. In some examples, the carrier frequencies $F_1$ and $F_h$ may differ by at least about 50 MHz, by at least about 100 MHz, by at least about 150 MHz, by at least 200 MHz, by at least 300 MHz, by at least 350 MHz, or by any other suitable value or range therebetween.

Discussed below is an exemplary implementation of the subject disclosure according to some embodiments as disclosed herein, in which Equation 2 shows that the input signal has low-frequency and high-frequency components; Equation 3 shows that the predistorted output signal also has low-frequency and high-frequency components; and Equations 4-5 show an exemplary method on how to calculate the predistorted low-frequency and high-frequency output signals using the coefficients. In some examples, assuming that the input signal from Equation 1 has two component carriers $x_L$ (lower component carrier) and $x_U$ (upper component carrier), the input signal x(n) can be expressed as follows (with implementation of same taking place within module 302, for example):

$$x(n) = x_L e^{-j\omega_0 t} + x_U e^{j\omega_0 t} \quad \text{(Equation 2)}$$

The predistorted signal y(n) from Equation (1) can then be expressed as follows (with implementation of same taking place within module 310, for example):

$$y(n) = y_L e^{-j\omega_0 t} + y_U e^{j\omega_0 t} \quad \text{(Equation 3)}$$

where $y_L$ and $y_U$ are the predistorted signals based on the following formulas (with the implementation of Equation 4 taking place in modules 306 and 326, and the implementation of Equation 5 taking place in modules 308 and 328, for example):

$$y_L(n) = \quad \text{(Equation 4)}$$

$$\left[ \sum_{l=0}^{N_{lb_{xb}}-1} x_L(n-l) \sum_{m=-N_{mc_{xb}}}^{N_{mb_{xb}}} b_{lm} \sum_{k=1}^{N_{kb_{xb}}} a_{mk} \right.$$

$$\left. \sum_{i=0}^{k} c_{ki} |x_L(n-l-m)|^{2(k-i)} |x_U(n-l-m)|^{2i} \right] +$$

$$\left[ \sum_{l=0}^{N_{lb_{xb}}-1} x_U(n-l) \sum_{m=-N_{mc_{xb}}}^{N_{mb_{xb}}} b_{lm} \sum_{k=1}^{N_{kb_{xb}}} a_{mk} \sum_{i=0}^{k} c_{ki} |x_L(n-l-m)|^{2(k-1-i)} \right.$$

$$\left. |x_U(n-l-m)|^{2i} x_L(n-l-m) x_U^*(n-l-m) \right] +$$

$$\left[ \sum_{l=0}^{N_{la_{xbim}}-1} x_U^*(n-l) \sum_{k=0}^{N_{ka_{xbim}}-1} b_{lk} \sum_{i=0}^{k} c_{ki} |x_U(n-l)|^{2i} |x_L(n-l)|^{2(k-i)} \right]$$

$$y_U(n) = \quad \text{(Equation 5)}$$

$$\left[ \sum_{l=0}^{N_{lb_{xb}}-1} x_U(n-l) \sum_{m=-N_{mc_{xb}}}^{N_{mb_{xb}}} b_{lm} \sum_{k=1}^{N_{kb_{xb}}} a_{mk} \right.$$

$$\left. \sum_{i=0}^{k} c_{ki} |x_U(n-l-m)|^{2(k-i)} |x_L(n-l-m)|^{2i} \right] +$$

$$\left[ \sum_{l=0}^{N_{lb_{xb}}-1} x_L(n-l) \sum_{m=-N_{mc_{xb}}}^{N_{mb_{xb}}} b_{lm} \sum_{k=1}^{N_{kb_{xb}}} a_{mk} \sum_{i=0}^{k} c_{ki} |x_U(n-l-m)|^{2(k-1-i)} \right.$$

$$\left. |x_L(n-l-m)|^{2i} x_U(n-l-m) x_L^*(n-l-m) \right] +$$

$$\left[ \sum_{l=0}^{N_{la_{xbim}}-1} x_L^*(n-l) \sum_{k=0}^{N_{ka_{xbim}}-1} b_{lk} \sum_{i=0}^{k} a_{mk} |x_L(n-l)|^{2i} |x_U(n-1)|^{2(k-i)} \right]$$

where:
- $N_{lb_{xb}}$ is the cross-band memory depth;
- $N_{mb_{xb}}$ is the cross-band backward cross term length;
- $N_{mc_{xb}}$ is the cross-band backward cross term length;
- $N_{kb_{xb}}$ is the cross-band nonlinearity order;
- $N_{la_{xbim}}$ is the cross-band image memory depth;
- $N_{ka_{xbim}}$ is the cross-band image nonlinearity order;
- $a_{mk}$, $b_{lk}$, $b_{lm}$, and $c_{ki}$ are the signal generation coefficients which may be stored in the memory as a matrix or a table;
- $x_U^*$ is the conjugative signal of $x_U$; and
- $x_L^*$ is the conjugative signal of $x_L$.

Advantages of implementing the signal transmission device or system as disclosed herein include the reduction in bandwidth necessary to process the input and output signals in determining the coefficients to be implemented for distortion compensation. By decomposing a signal into two separate signals, each with a component carrier at a frequency different from the other, the signal processing can be performed using a narrower bandwidth which encompasses only one of the component carriers instead of both the component carriers, as known in the art. As such, the reduction in processing bandwidth improves the efficiency of signal processing by reducing the processing load for updating the distortion compensation characteristics. Reduction in processing load allows the processor to more frequently perform updates of the distortion compensation characteristics (that is, the signal generation coefficients) in preparation for a change in distortion.

The present subject matter may be embodied in other specific forms without departing from the scope of the present disclosure. The described embodiments are to be considered in all respects only as illustrative and not restrictive. Those skilled in the art will recognize that other implementations consistent with the disclosed embodiments are possible. The above detailed description and the examples described therein have been presented for the purposes of illustration and description only and not for limitation. For example, the operations described can be done in any suitable manner. The methods can be performed in any suitable order while still providing the described operation and results. It is therefore contemplated that the present embodiments cover any and all modifications, variations, or equivalents that fall within the scope of the basic underlying principles disclosed above and claimed herein. Furthermore, while the above description describes hardware in the form of a processor executing code, hardware in the form of a state machine, or dedicated logic capable of producing the same effect, other structures are also contemplated.

What is claimed is:

1. A transmitter system comprising:
   an intermodulation distortion (IMD) filter module configured to filter a detected feedback signal ($Y_{in}$) to generate a targeted filtered signal ($Y_{out}$), the IMD filter module comprising:
      a gain mask generating module configured to generate a gain mask based on at least one transmission measurement;
      a gain mask processing module configured to apply the gain mask to the detected feedback signal ($Y_{in}$);
      a filter design generating module configured to generate a signal filter based on at least one transmission requirement; and
      a targeted filtered signal generating module configured to generate the targeted filtered signal ($Y_{out}$) based on the signal filter;
   a digital pre-distortion (DPD) coefficient estimation module configured to update signal generation coefficients based on comparing an input signal ($S_{in}$) with the targeted filtered signal ($Y_{out}$); and
   a distortion compensation processing module configured to generate a pre-distorted signal ($U_{out}$) based on the input signal ($S_{in}$) using the updated signal generation coefficients.

2. The system of claim 1, wherein the at least one transmission measurement includes a gain response of an amplifier of the transmitter system in a frequency range.

3. The system of claim 1, wherein the at least one transmission requirement includes standards requirement according to 5G New Radio (NR) specification.

4. The system of claim 1, wherein the gain mask processing module is configured to generate a gain compensated signal, and the targeted filtered signal generating module is configured to generate the targeted filtered signal ($Y_{out}$) by applying the signal filter on the gain compensated signal.

5. The system of claim 4, wherein the targeted filtered signal generating module is configured to generate the targeted filtered signal ($Y_{out}$) by reducing gain of the gain compensated signal except at desired frequency components of the gain compensated signal, and the desired frequency components are determined based on the transmission requirement.

6. A method comprising:
filtering, by an intermodulation distortion (IMD) filter module, a detected feedback signal ($Y_{in}$) to generate a targeted filtered signal ($Y_{out}$) by:
generating, by a gain mask generating module of the IMD filter module, a gain mask based on at least one transmission measurement;
applying, by a gain mask processing module of the IMD filter module, the gain mask to the detected feedback signal ($Y_{in}$);
generating, by a filter design generating module of the IMD filter module, a signal filter based on at least one transmission requirement; and
generating, by a targeted filtered signal generating module of the IMD filter module, the targeted filtered signal ($Y_{out}$) based on the signal filter;
updating, by a digital pre-distortion (DPD) coefficient estimation module, signal generation coefficients based on comparing an input signal ($S_{in}$) with the targeted filtered signal ($Y_{out}$); and
generating, by a distortion compensation processing module, a pre-distorted signal ($U_{out}$) based on the input signal ($S_{in}$) using the updated signal generation coefficients.

7. The method of claim 6, wherein the at least one transmission measurement includes a gain response of an amplifier of the transmitter system in a frequency range.

8. The method of claim 6, wherein the at least one transmission requirement includes standards requirement according to 5G New Radio (NR) specification.

9. The method of claim 8, further comprising:
generating, by the targeted filtered signal generating module, the targeted filtered signal ($Y_{out}$) by reducing gain of the gain compensated signal except at desired frequency components of the gain compensated signal,
wherein the desired frequency components are determined based on the transmission requirement.

10. The method of claim 6, further comprising:
generating, by the gain mask processing module, a gain compensated signal; and
generating, by the targeted filtered signal generating module, the targeted filtered signal ($Y_{out}$) by applying the signal filter on the gain compensated signal.

11. A non-transitory computer-readable medium storing instructions therein which, when run on a processor, causes the processor to:
filter a detected feedback signal ($Y_{in}$) to generate a targeted filtered signal ($Y_{out}$) by:
generating a gain mask based on at least one transmission measurement;
applying the gain mask to the detected feedback signal ($Y_{in}$);
generating a signal filter based on at least one transmission requirement; and
generating the targeted filtered signal ($Y_{out}$) based on the signal filter;
update signal generation coefficients based on comparing an input signal ($S_{in}$) with the targeted filtered signal ($Y_{out}$); and
generate a pre-distorted signal ($U_{out}$) based on the input signal ($S_{in}$) using the updated signal generation coefficients.

12. The computer-readable medium of claim 11, wherein the at least one transmission measurement includes a gain response of an amplifier of the transmitter system in a frequency range.

13. The computer-readable medium of claim 11, wherein the at least one transmission requirement includes standards requirement according to 5G New Radio (NR) specification.

14. The computer-readable medium of claim 11, wherein the instructions further cause the processor to:
generate a gain compensated signal; and
generate the targeted filtered signal ($Y_{out}$) by applying the signal filter on the gain compensated signal.

15. The computer-readable medium of claim 14, wherein the instructions further cause the processor to:
generate the targeted filtered signal ($Y_{out}$) by reducing gain of the gain compensated signal except at desired frequency components of the gain compensated signal, wherein the desired frequency components are determined based on the transmission requirement.

16. A transmitter system comprising:
a signal decomposition module configured to extract a low-frequency signal ($S_{lo}$) and a high-frequency signal ($S_{hi}$) from an input signal ($S_{in}$);
a distortion compensation processing module configured to generate a pre-distorted low-frequency signal ($U_{lo}$) and a pre-distorted high-frequency signal ($U_{hi}$) based on the low-frequency signal ($S_{lo}$) and the high-frequency signal ($S_{hi}$) using signal generation coefficients;
a signal combining module configured to combine the pre-distorted low-frequency signal ($U_{lo}$) and the pre-distorted high-frequency signal ($U_{hi}$);
an intermodulation distortion (IMD) filter module configured to filter a detected low-frequency feedback signal ($Y_{lo}$) to generate a targeted low-frequency filtered signal ($Y_{lo}$') and filter a detected high-frequency feedback signal ($Y_{hi}$) to generate a targeted high-frequency filtered signal ($Y_{hi}$'), the IMD filter module comprising a low-frequency IMD filter module and a high-frequency IMD filter module each comprising:
a gain mask generating module configured to generate a gain mask based on at least one transmission measurement;
a gain mask processing module configured to apply the gain mask to the detected high-frequency or low-frequency feedback signal ($Y_{lo}$ or $Y_{hi}$);
a filter design generating module configured to generate a signal filter based on at least one transmission requirement; and
a targeted filtered signal generating module configured to generate the targeted high-frequency or low-frequency filtered signal ($Y_{lo}$' or $Y_{hi}$') based on the signal filter; and
a signal characteristic estimation processing module configured to update the signal generation coefficients used by the distortion compensation processing module based on comparing the low-frequency signal ($S_{lo}$) and the high-frequency signal ($S_{hi}$) with the targeted low-frequency filtered signal ($Y_{lo}$') and the targeted high-frequency filtered signal ($Y_{hi}$').

17. The system of claim 16, wherein the detected feedback low-frequency signal ($Y_{lo}$) is obtained by demodulating an output signal ($S_{out}$) of the system at a first frequency (Fl) and the detected feedback high-frequency signal ($Y_{hi}$) is obtained by demodulating the output signal ($S_{out}$) at a second frequency (Fh) different from the first frequency value.

18. A method comprising:
   extracting, by a signal decomposition module, a low-frequency signal ($S_{lo}$) and a high-frequency signal ($S_{hi}$) from an input signal ($S_{in}$);
   generating, by a distortion compensation processing module, a pre-distorted low-frequency signal ($U_{lo}$) and a pre-distorted high-frequency signal ($U_{hi}$) based on the low-frequency signal ($S_{lo}$) and the high-frequency signal ($S_{hi}$) using signal generation coefficients;
   combining, by a signal combining module, the pre-distorted low-frequency signal ($U_{lo}$) and the pre-distorted high-frequency signal ($U_{hi}$);
   filtering, by an intermodulation distortion (IMD) filter module, a detected low-frequency feedback signal ($Y_{lo}$) to generate a targeted low-frequency filtered signal ($Y_{lo}'$) and filter a detected high-frequency feedback signal ($Y_{hi}$) to generate a targeted high-frequency filtered signal ($Y_{hi}'$) by:
      generating, by a gain mask generating module of the IMD filter module, a low-frequency gain mask and a high-frequency gain mask based on at least one transmission measurement;
      applying, by a gain mask processing module of the IMD filter module, the low-frequency and high-frequency gain masks to the detected low-frequency feedback signal ($Y_{lo}$) and the detected high-frequency feedback signal ($Y_{hi}$), respectively;
      generating, by a filter design generating module of the IMD filter module, a low-frequency signal filter and a high-frequency signal filter based on at least one transmission requirement; and
      generating, by a targeted filtered signal generating module of the IMD filter module, the targeted low-frequency filtered signal ($Y_{lo}'$) based on the low-frequency signal filter and the targeted high-frequency filtered signal ($Y_{hi}'$) based on the high-frequency signal filter; and
   updating, by a signal characteristic estimation processing module, the signal generation coefficients used by the distortion compensation processing module based on comparing the low-frequency signal ($S_{lo}$) and the high-frequency signal ($S_{hi}$) with the targeted low-frequency filtered signal ($Y_{lo}'$) and the targeted high-frequency filtered signal ($Y_{hi}'$).

19. The method of claim 18, further comprising:
   generating the detected feedback low-frequency signal ($Y_{lo}$) by demodulating an output signal ($S_{out}$) of the system at a first frequency (Fl); and
   generating the detected feedback high-frequency signal ($Y_{hi}$) by demodulating the output signal ($S_{out}$) at a second frequency (Fh) different from the first frequency value.

20. A non-transitory computer-readable medium storing instructions therein which, when run on a processor, causes the processor to:
   extract a low-frequency signal ($S_{lo}$) and a high-frequency signal ($S_{hi}$) from an input signal ($S_{in}$);
   generate a pre-distorted low-frequency signal ($U_{lo}$) and a pre-distorted high-frequency signal ($U_{hi}$) based on the low-frequency signal ($S_{lo}$) and the high-frequency signal ($S_{hi}$) using signal generation coefficients;
   combine the pre-distorted low-frequency signal ($U_{lo}$) and the pre-distorted high-frequency signal ($U_{hi}$);
   filter a detected low-frequency feedback signal ($Y_{lo}$) to generate a targeted low-frequency filtered signal ($Y_{lo}'$) and filter a detected high-frequency feedback signal ($Y_{hi}$) to generate a targeted high-frequency filtered signal ($Y_{hi}'$) by:
      generating a low-frequency gain mask and a high-frequency gain mask based on at least one transmission measurement;
      applying the low-frequency and high-frequency gain masks to the detected low-frequency feedback signal ($Y_{lo}$) and the detected high-frequency feedback signal ($Y_{hi}$), respectively;
      generating a low-frequency signal filter and a high-frequency signal filter based on at least one transmission requirement; and
      generating the targeted low-frequency filtered signal ($Y_{lo}'$) based on the low-frequency signal filter and the targeted high-frequency filtered signal ($Y_{hi}'$) based on the high-frequency signal filter; and
   update the signal generation coefficients used by the distortion compensation processing module based on comparing the low-frequency signal ($S_{lo}$) and the high-frequency signal ($S_{hi}$) with the targeted low-frequency filtered signal ($Y_{lo}'$) and the targeted high-frequency filtered signal ($Y_{hi}'$).

21. The computer-readable medium of claim 20, wherein the instructions further cause the processor to:
   generate the detected feedback low-frequency signal ($Y_{lo}$) by demodulating an output signal ($S_{out}$) of the system at a first frequency (Fl); and
   generate the detected feedback high-frequency signal ($Y_{hi}$) by demodulating the output signal ($S_{out}$) at a second frequency (Fh) different from the first frequency value.

* * * * *